US008035278B2

(12) United States Patent
Shikata et al.

(10) Patent No.: US 8,035,278 B2
(45) Date of Patent: Oct. 11, 2011

(54) ULTRASONIC PROBE, ULTRASONIC DIAGNOSIS APPARATUS, AND ULTRASONIC PROBE MANUFACTURING METHOD

(75) Inventors: Hiroyuki Shikata, Nasushiobara (JP); Takashi Takeuchi, Otawara (JP)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 0 days.

(21) Appl. No.: 12/274,689

(22) Filed: Nov. 20, 2008

(65) Prior Publication Data

US 2009/0134746 A1 May 28, 2009

(30) Foreign Application Priority Data

Nov. 22, 2007 (JP) ................................ 2007-303253

(51) Int. Cl.
*H01L 41/08* (2006.01)

(52) U.S. Cl. ....................................................... 310/334

(58) Field of Classification Search .................. 310/334; 600/447

See application file for complete search history.

(56) References Cited

U.S. PATENT DOCUMENTS

| | | | | |
|---|---|---|---|---|
| 4,583,018 | A * | 4/1986 | Izumi et al. | 310/334 |
| 6,396,199 | B1 * | 5/2002 | Douglas et al. | 310/335 |
| 6,607,491 | B2 * | 8/2003 | Sato | 600/459 |
| 6,894,425 | B1 * | 5/2005 | Solomon et al. | 310/334 |
| 7,598,658 | B2 * | 10/2009 | Takeuchi et al. | 310/334 |
| 7,678,055 | B2 * | 3/2010 | Sudo et al. | 600/459 |

FOREIGN PATENT DOCUMENTS

JP 7-37107 7/1995

OTHER PUBLICATIONS

Office Action issued Nov. 30, 2010 in Korean Application No. 10-2008-0116075.

* cited by examiner

*Primary Examiner* — Mark Budd
(74) *Attorney, Agent, or Firm* — Oblon, Spivak, McClelland, Maier & Neustadt, L.L.P.

(57) ABSTRACT

A plurality of piezoelectric elements are arrayed two-dimensionally. A plurality of electrodes are respectively formed on the plurality of piezoelectric elements. A plurality of non-conductive members have columnar shape and are arranged on the plurality of electrodes. A plurality of internal metal layers are respectively provided for the plurality of non-conductive members. The internal metal layers reach from arrangement surfaces of the non-conductive members to other surfaces of the non-conductive members. The arrangement surfaces are opposite to the other surfaces.

18 Claims, 14 Drawing Sheets

ULTRASONIC PROBE, ULTRASONIC DIAGNOSIS APPARATUS, AND ULTRASONIC PROBE MANUFACTURING METHOD

CROSS-REFERENCE TO RELATED APPLICATIONS

This application is based upon and claims the benefit of priority from prior Japanese Patent Application No. 2007-303253, filed Nov. 22, 2007, the entire contents of which are incorporated herein by reference.

BACKGROUND OF THE INVENTION

1. Field of the Invention

The present invention relates to an ultrasonic probe and an ultrasonic diagnosis apparatus having a two-dimensional array structure, and an ultrasonic probe manufacturing method.

2. Description of the Related Art

An ultrasonic probe having a one-dimensional array structure is available. A transducer unit included in this one-dimensional array ultrasonic probe has a plurality of transducers arrayed in a line. In general, electrodes on the upper and lower surfaces of the transducer unit are extracted from an end of the transducer unit. Various contrivances have been made to extract upper surface electrodes. For example, there is available a technique of electrically extracting upper surface electrodes from the lower surface of a transducer unit via an FPC (Flexible Printed Circuit board) by plating a side surface of the transducer unit to render the upper and lower surfaces conductive. The signals extracted by the FPC are transmitted to a transmission/reception circuit via a probe cable.

In general, the acoustic impedance of polyimide used as a base material for an FPC is about 3 MRayl. The acoustic impedance of a transducer unit is equal to or more than 30 MRayl. For this reason, when the FPC is directly joined to the transducer unit, an acoustic mismatch occurs. In order to reduce this acoustic mismatch, an acoustic matching layer having an acoustic impedance between 3 MRayl and 30 MRayl is used. This acoustic matching layer is placed on the upper surface of the transducer unit, and the FPC is placed on the upper surface of the placed acoustic matching layer. Upper surface electrodes are electrically extracted via this FPC.

In the case of specifications with three acoustic matching layers added to a transducer unit, the first acoustic matching layer has the best acoustic impedance of about 9 to 15 MRayl. A material having such an acoustic impedance is a ceramic material containing mica as a main component. This ceramic material is known as a machinable ceramic material. This material has non-conductivity. There is a technique uses a method of plating all the surfaces of the first acoustic matching layer using this non-conductive material and electrically extracting upper surface electrodes formed out of a piezoelectric element to the upper surface of the acoustic matching layer.

In a three-layer specification two-dimensional array ultrasonic probe, a multilayer structure comprising a plate-like piezoelectric member, a first acoustic matching layer member, and a second acoustic matching layer member is cut in a lattice form. With this cutting, each acoustic matching layer is divided into a plurality of acoustic matching elements arrayed two-dimensionally. In the above method of extracting upper surface electrodes by plating the surrounding portion, the upper and lower surfaces of acoustic matching elements other than those located outside the first acoustic matching layer are not rendered conductive.

As another method of electrically extracting upper surface electrodes to the upper surface of an acoustic matching layer, a method of attaching a conductive pattern to a side surface of an acoustic matching layer has been proposed. In this method, however, pattern attachment processing needs to be performed for each column. This increases the number of steps, resulting in an increase in cost.

BRIEF SUMMARY OF THE INVENTION

It is an object of the present invention to provide a two-dimensional array ultrasonic probe in which the upper and lower surfaces of each element of an acoustic matching layer can be easily and reliably rendered conductive, an ultrasonic diagnosis apparatus, and an ultrasonic probe manufacturing method.

An ultrasonic probe according to a first aspect of the present invention comprising: a plurality of piezoelectric elements arrayed two-dimensionally; a plurality of electrodes respectively formed on the plurality of piezoelectric elements; a plurality of columnar non-conductive members arranged on the plurality of electrodes; and a plurality of first conductive layers respectively provided for the plurality of non-conductive members, the first conductive layers reaching from arrangement surfaces of the non-conductive members to other surfaces of the non-conductive members, the arrangement surfaces being opposite to the other surfaces.

An ultrasonic diagnosis apparatus according to a second aspect of the present invention configured to scans a subject with an ultrasonic wave via an ultrasonic probe, the ultrasonic probe comprising: a plurality of piezoelectric elements arrayed two-dimensionally, a plurality of electrodes respectively formed on the plurality of piezoelectric elements, a plurality of columnar non-conductive members arranged on the plurality of electrodes, and a plurality of conductive layers respectively formed on the plurality of non-conductive members, the conductive layers reaching from arrangement surfaces of the non-conductive members to other surfaces of the non-conductive members, the arrangement surfaces being opposite to the other surfaces.

An ultrasonic probe manufacturing method according to a third aspect of the present invention comprising: forming a conductive layer on at least one surface of each of a plurality of plate-like non-conductive members; forming a non-conductive member block by joining a plurality of non-conductive members on which the conductive layer are formed; and forming a plurality of plate-like acoustic matching members by cutting the formed non-conductive member block in a direction substantially perpendicular to the one surface.

An ultrasonic probe manufacturing method according to a forth aspect of the present invention comprising: joining a plate-like piezoelectric member having two surfaces on which electrodes are formed to a plate-like acoustic matching member having a plurality of conductive layers parallel to each other such that the electrodes are substantially perpendicular to the conductive layers; and forming a plurality of elements by cutting the joined acoustic matching member and the piezoelectric member vertically and horizontally to a joint surface between the acoustic matching member and the piezoelectric member.

An ultrasonic probe according to a fifth aspect of the present invention comprising: a plurality of transducers having a plurality of piezoelectric elements arrayed two-dimensionally and a plurality of electrodes formed on the plurality of piezoelectric elements; and an acoustic matching layer provided on the plurality of transducers, the acoustic matching layer having a plurality of non-conductive members arrayed two-dimensionally and a plurality of conductive layers for electrically extracting the plurality of electrodes to surfaces of the non-conductive members.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An ultrasonic probe, ultrasonic diagnosis apparatus, and ultrasonic probe manufacturing method according to an embodiment of the present invention will be described below.

Figure 1:
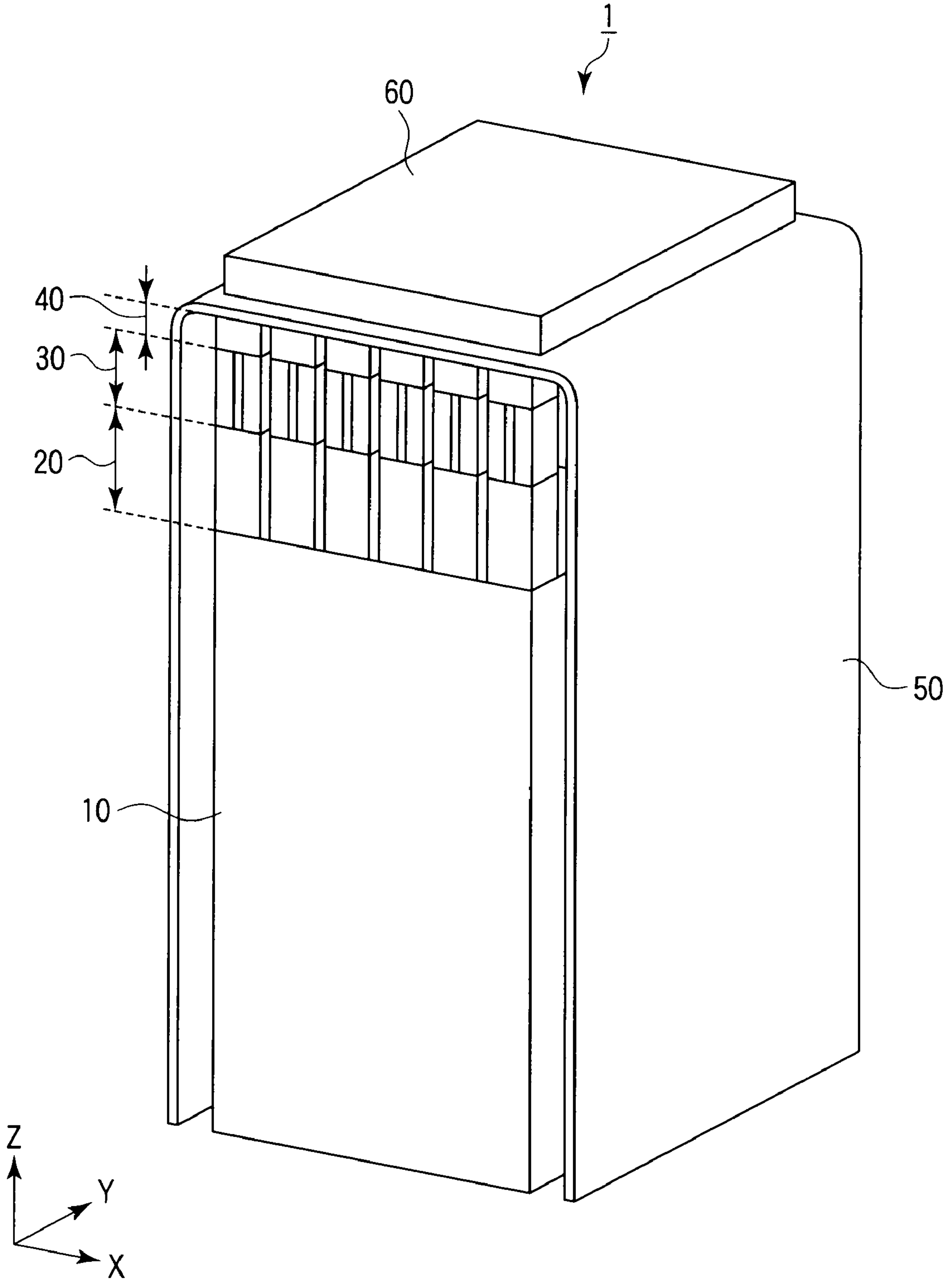
FIG. 1 is a perspective view showing the schematic structure of an ultrasonic probe according to an embodiment of the present invention.

FIG. 1 is a perspective view showing the schematic structure of an ultrasonic probe 1 according to this embodiment. As shown in FIG. 1, the ultrasonic probe 1 has a backing 10 as a sound-absorbing material. The backing 10 has a rectangular block shape. A transducer unit 20 is joined to the upper surface of the backing 10 via a first flexible printed circuit board (not shown) (to be referred to as an FPC hereinafter). A first acoustic matching layer 30 is joined to the upper surface of the transducer unit 20. A second acoustic matching layer 40 is joined to the upper surface of the first acoustic matching layer 30. A third acoustic matching layer 60 is joined to the upper surface of the second acoustic matching layer 40 via a second FPC 50. Although not shown, an acoustic lens is joined to the upper surface of the third acoustic matching layer 60. In this case, the stacking direction (thickness direction) of the respective members is defined as the Z-axis, and a plane perpendicular to the Z-axis is defined as an X-Y plane. The X-Y plane is defined by the X- and Y-axes perpendicular to each other.

The transducer unit 20 emits an ultrasonic wave in the plus Z direction upon receiving a driving pulse from a transmission circuit (not shown in FIG. 1). The emitted ultrasonic wave is reflected by a subject. The transducer unit 20 receives the reflected ultrasonic wave as an echo signal.

The acoustic impedance of the transducer unit 20 is equal to or more than 30 Mrayl (Mrayl=$10^6$ kg/$m^2$ s). The transducer unit 20 is formed out of a piezoelectric ceramic material, e.g., PZT. The acoustic impedance of polyimide as a base material for the first FPC and second FPC 50 is about 3 Mrayl. The acoustic impedance of the first acoustic matching layer 30 is about 9 to 15 Mrayl. The first acoustic matching layer 30 is formed out of a non-conductive member, e.g., a ceramic material containing mica as a main component which is called a machinable ceramic material. The non-conductive member can be filler-containing epoxy resin. The filler is preferably a granular metal or metal oxide. The metal is preferably tungsten or the like. The non-conductive member may also be formed out of a fine ceramic material containing an inorganic substance. The acoustic impedance of the second acoustic matching layer 40 is about 4 to 7 Mrayl. The second acoustic matching layer 40 is formed out of a conductive member, e.g., carbon (isotropic graphite or graphite). The acoustic impedance of the third acoustic matching layer 60 is about 1.8 to 2.5 Mrayl. The third acoustic matching layer 60 is formed out of a non-conductive member, e.g., a resin. The acoustic impedance of the subject is almost equal to the acoustic impedance of water, i.e., about 1.5 MRayl. As described above, the acoustic impedances of the acoustic matching layers 30, 40, and 60 realize the optimal acoustic impedance of the three-layer specification $\lambda/4$ acoustic matching layer. This can attain a wideband characteristic for ultrasonic waves.

Figure 2:
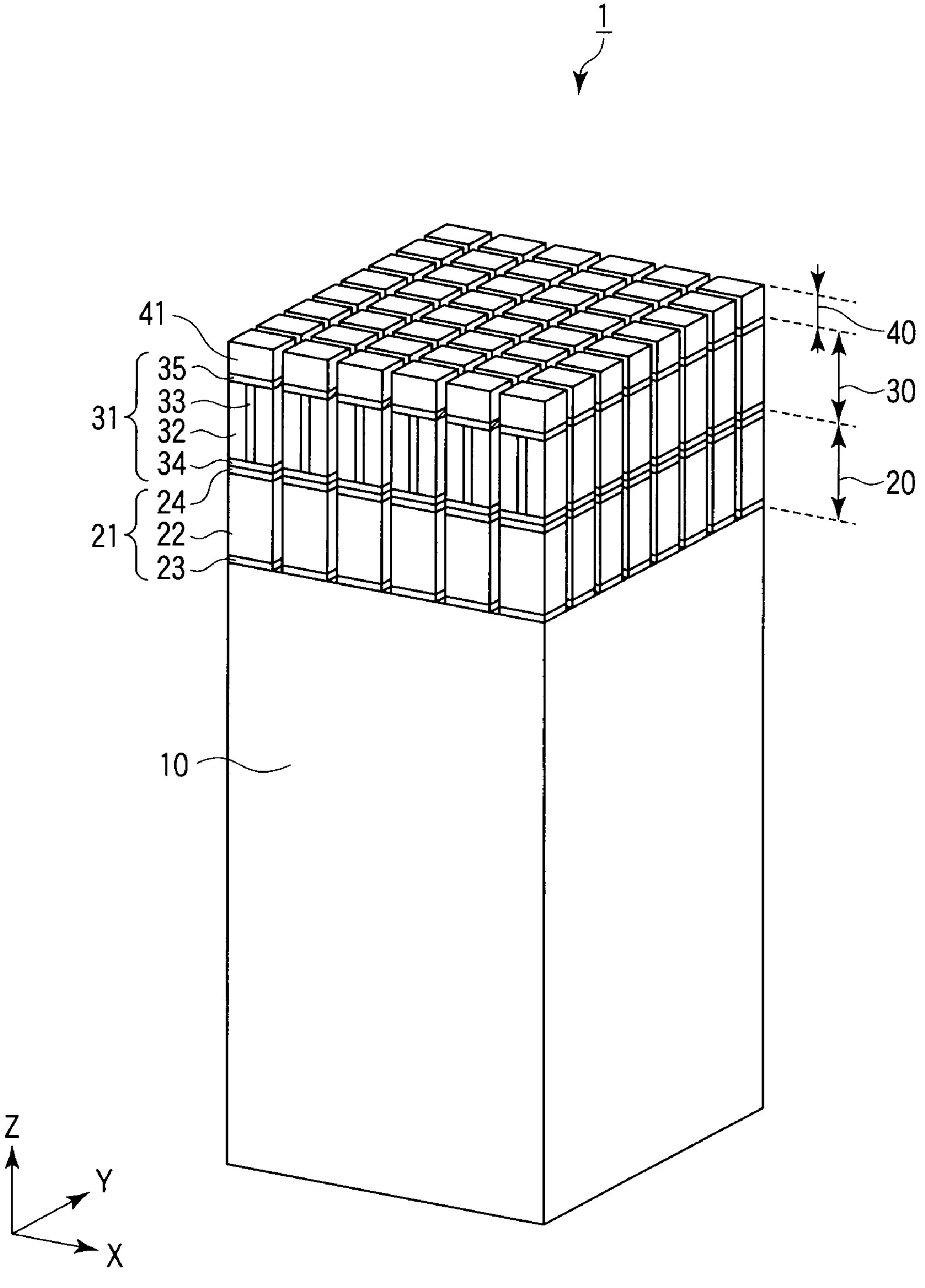
FIG. 2 is a perspective view of the ultrasonic probe in FIG. 1 from which a second FPC and a third acoustic matching layer are omitted.

FIG. 2 is a perspective view of the ultrasonic probe 1 in FIG. 1 from which the second FPC 50 and the third acoustic matching layer 60 are omitted. As shown in FIG. 2, the ultrasonic probe 1 has a two-dimensional array structure. The transducer unit 20 has a plurality of columnar transducers 21 arrayed in the X and Y directions at pitches (center-to-center intervals). Each transducer 21 includes a piezoelectric element 22 made of PZT or the like, a planar lower electrode 23 formed on the lower surface of the piezoelectric element 22, and a planar upper electrode 24 formed on the upper surface of the piezoelectric element 22.

The first acoustic matching layer 30 has a plurality of columnar first acoustic matching elements 31 arranged two-dimensionally. Each first acoustic matching element 31 is placed on each transducer 21. Each first acoustic matching element 31 has a non-conductive member 32 processed into a columnar shape and formed out of a machinable ceramic material or a filler-containing epoxy resin, an internal metal layer 33 formed inside the non-conductive member 32, a lower metal layer 34 formed on the lower surface of the non-conductive member 32, and an upper metal layer 35 formed on the upper surface of the non-conductive member 32. The internal metal layer 33, lower metal layer 34, and upper metal layer 35 have conductivity In general, each of the metal layers 33, 34, and 35 is formed by electrolytic plating with gold or the like having high corrosion resistance using, as a substrate, an electroless plating made of a material which facilitates securement of adhesive strength for an inorganic substance such as a copper plating, nickel, or chromium. In addition, each of the metal layers 33, 34, and 35 can be formed by a dry process such as sputtering or vapor deposition. The width (in the X direction) of each of the metal layers 33, 34, and 35 is about 1 to 4 μm, which satisfies requirements for connection reliability, avoidance of adverse acoustic effects, and high machinability in a cutting process.

The internal metal layer 33 is provided for the first acoustic matching element 31. More specifically, the internal metal layer 33 extends through the interior of the non-conductive member 32 to reach from the lower surface (arrangement surface) to the upper surface of the non-conductive member 32. In other words, the internal metal layer 33 extends through the non-conductive member 32 to be exposed onto the lower and upper surface of the non-conductive member 32. According to such a placement relationship, the internal metal layer 33 renders the upper and lower surfaces of the first acoustic matching element 31 conductive. The lower surfaces are opposite to the upper surfaces. The lower surfaces and the upper surfaces are parallel to each other. The internal metal layers 33 electrically extract the upper electrodes 24 to the upper surface of the first acoustic matching element 31. The internal metal layers 33 are parallel to each other. The internal metal layers 33 are arrayed vertically to the upper electrodes 24. Scattering of ultrasonic waves by the internal metal layers 33 is minimized according to the positional relationship between the internal metal layers 33 and the upper electrodes 24. Although described later, various patterns can be used as the array direction of the internal metal layers 33 and the pitch between them.

The lower metal layers 34 and the upper metal layers 35 are formed to improve the certainty/reliability of conduction between the upper and lower surfaces of the first acoustic matching element 31. In other words, if the upper and lower surfaces of the first acoustic matching element 31 can be rendered conductive by using only the internal metal layer 33, the lower metal layer 34 and the upper metal layer 35 are not required.

The second acoustic matching layer 40 has a plurality of second acoustic matching elements 41 arranged two-dimensionally. The second acoustic matching element 41 has conductivity and is formed out of a conductive member such as a carbon. The second acoustic matching elements 41 are joined to the first acoustic matching elements 31.

As shown in FIG. 1, the second FPC 50 is mounted on the upper surface of the second acoustic matching layer 40. The second FPC 50 independently and electrically extracts each upper electrode 24 via each lower metal layer 34, each internal metal layer 33, each upper metal layer 35, and each second acoustic matching element 41.

Figure 3:
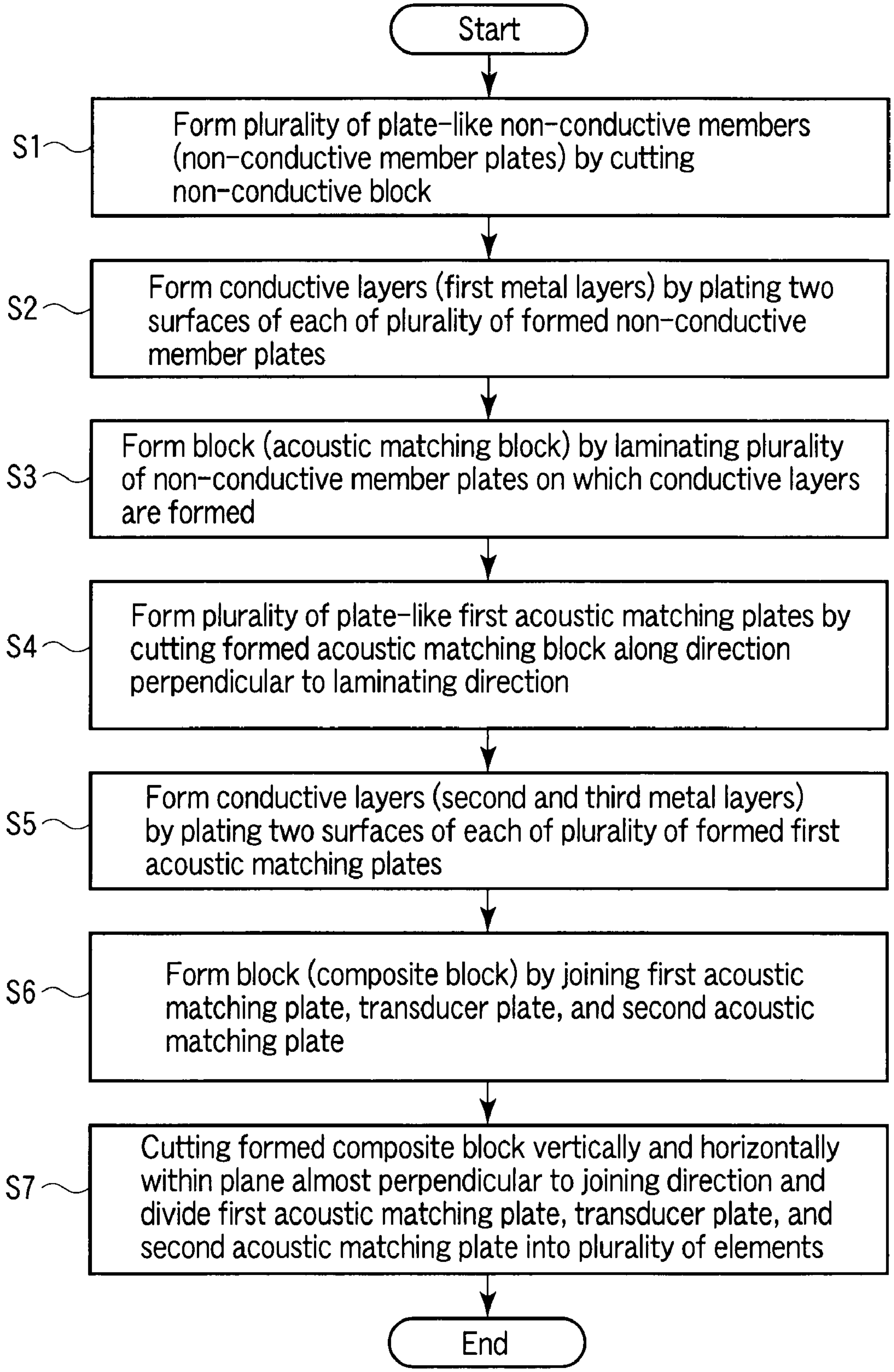
FIG. 3 is a flowchart showing a sequence in an ultrasonic probe manufacturing process in FIG. 1.
Figure 4:
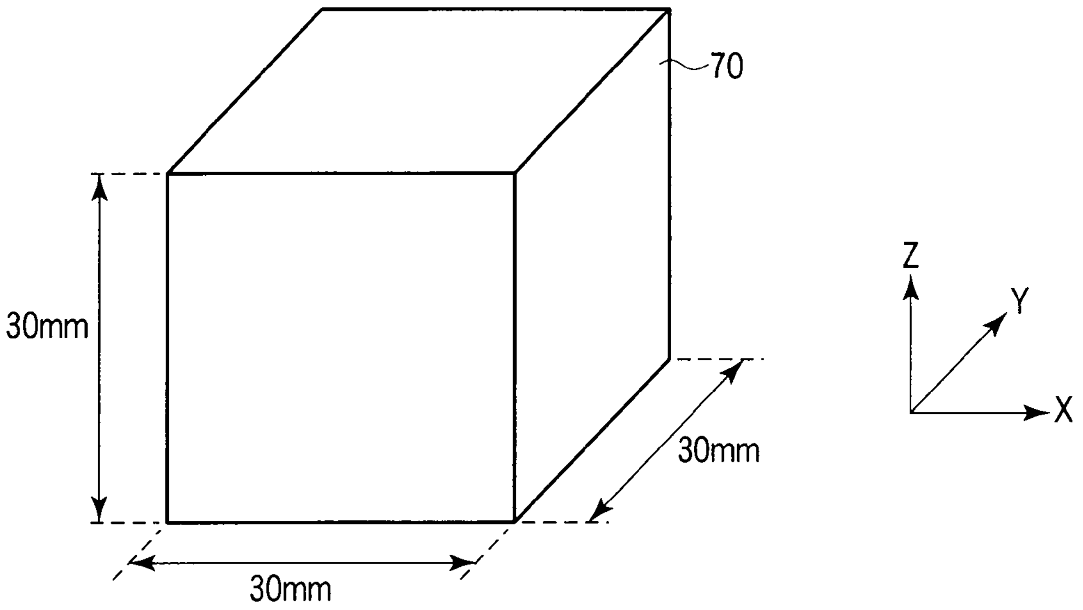
FIG. 4 is a perspective view showing a non-conductive block associated with the ultrasonic probe manufacturing process in FIG. 1.

A method of manufacturing the first acoustic matching layer 30 will be described before a detailed description of the structure of the first acoustic matching layer 30. FIG. 3 is a flowchart showing a manufacturing process for the first acoustic matching layer 30. First of all, a non-conductive block 70 having a cubic shape like that shown in FIG. 4 is prepared. Each side of the non-conductive block 70 has a predetermined length. The predetermined length is, for example, 30 mm.

Figure 5:
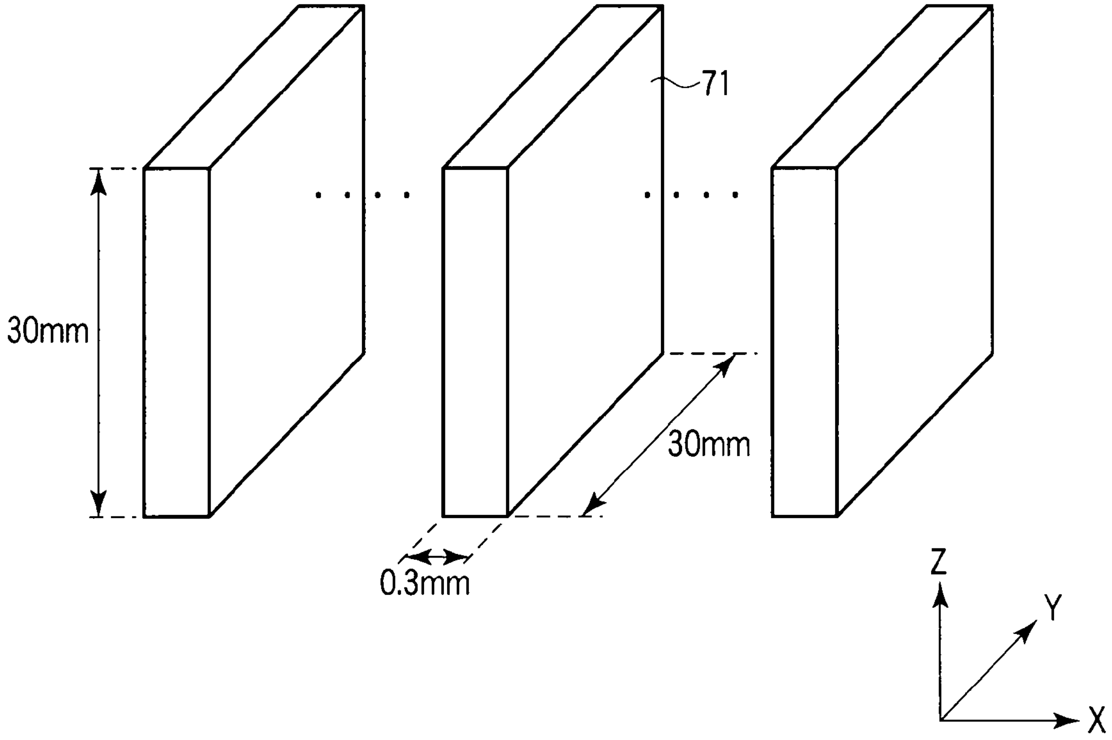
FIG. 5 is a perspective view showing non-conductive members associated with the ultrasonic probe manufacturing process in FIG. 1.

A plurality of non-conductive member plates 71, each having a plate-like shape like that shown in FIG. 5, are formed by cutting the non-conductive block 70 at a predetermined pitch along the Y-axis (step S1). The left and right surfaces (both of which are almost perpendicular to the X-axis) of the formed non-conductive member plate 71 are polished to obtain a predetermined thickness. For example, the predetermined thickness is 0.3 mm.

Figure 6:
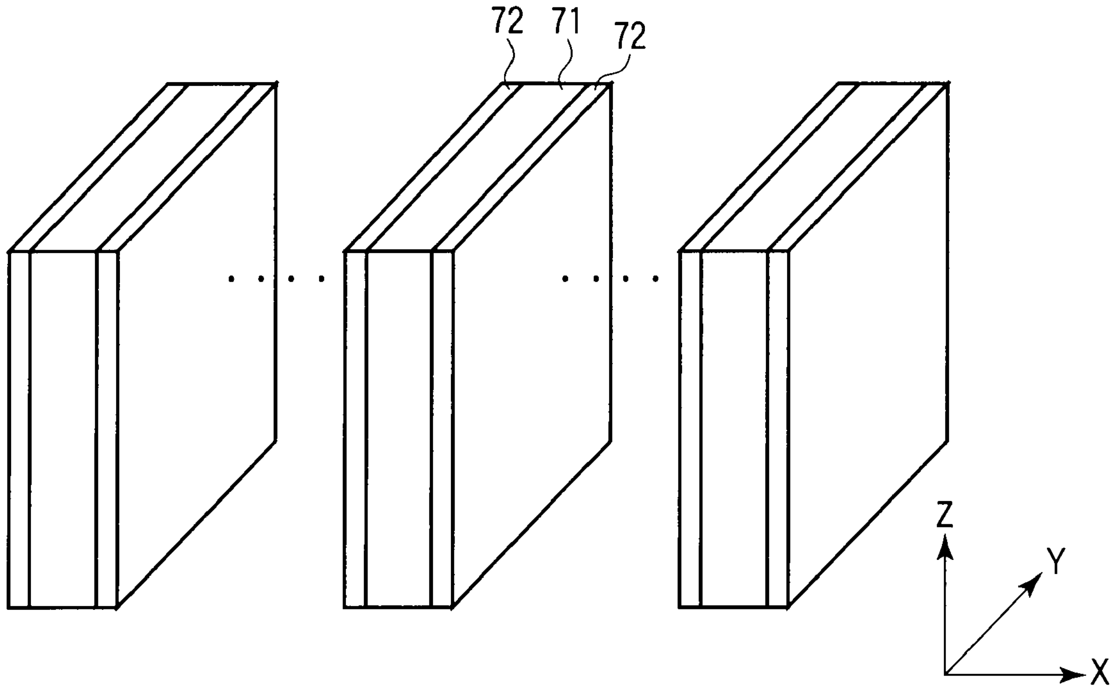
FIG. 6 is a perspective view showing non-conductive members on which first metal layers are formed and which are associated with the ultrasonic probe manufacturing process in FIG. 1.

As shown in FIG. 6, a plurality of first metal layers 72 are formed on the plurality of polished non-conductive member plates 71 by sputtering, vapor deposition, plating, or the like (step S2). In a wet process such as plating, the first metal layer 72 is formed on all the surfaces of the non-conductive member plate 71. In a dry process such as sputtering or vapor deposition, one or two first metal layers 72 may be formed on only one or two surfaces of the non-conductive member plate 71. Assume that in the following description, the first metal layers 72 are formed on the left and right surfaces of the non-conductive member plate 71.

Figure 7:
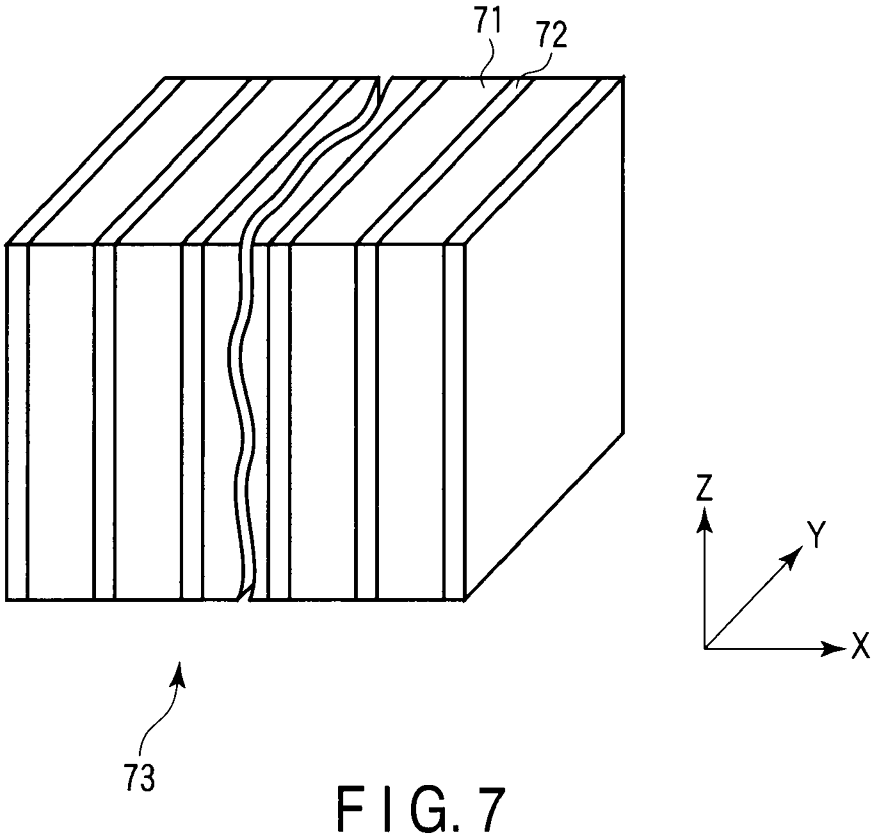
FIG. 7 is a perspective view showing an acoustic matching block associated with the ultrasonic probe manufacturing process in FIG. 1.

As shown in FIG. 7, the plurality of non-conductive member plates 71 on which the first metal layers 72 are formed are laminated to form an acoustic matching block 73 comprising the plurality of first metal layers 72 and the plurality of non-conductive member plates 71 (step S3). A typical laminating method is to coat the non-conductive member plates 71 with a resin adhesive such as an epoxy adhesive and bond them upon minimizing the thicknesses of the adhesive layers by hot pressing. The heat resistance of a non-conductive member is higher than that of a metal such as tin or silver. Forming the first metal layers 72 on the two surfaces therefore can metal-weld the adjacent first metal layers 72 by hot pressing at a higher temperature without using any adhesive. If the first metal layer 72 is formed on one surface of each non-conductive member plate 71, it is necessary to laminate the first metal layers 72 upon orienting them to one side in order to make the pitches between the first metal layers 72 almost constant. FIG. 7 shows only the two end portions of the acoustic matching block 73 without illustrating the intermediate portion.

Figure 8:
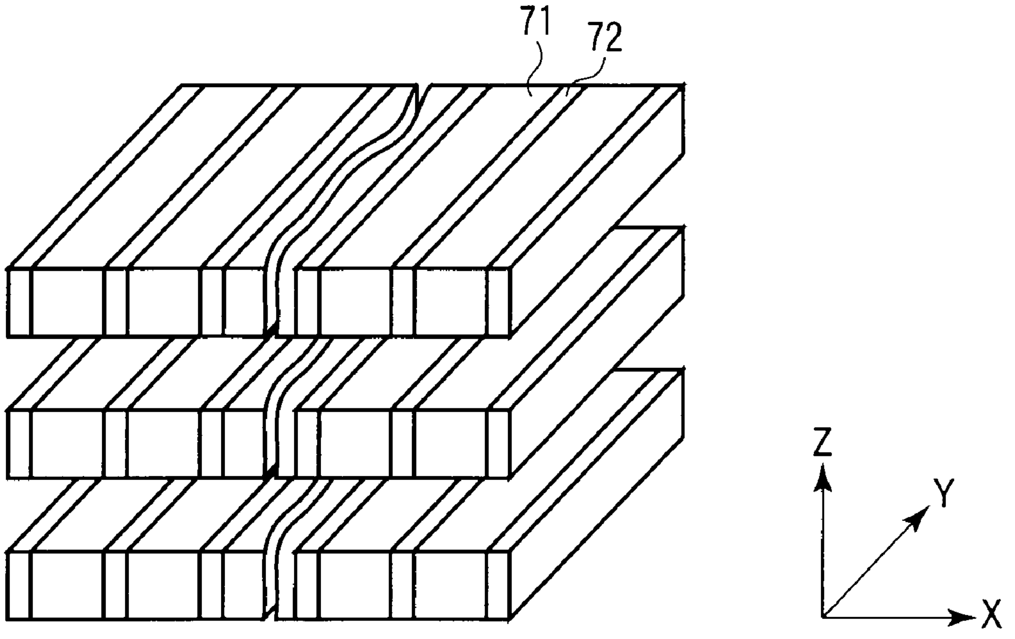
FIG. 8 is a perspective view showing first acoustic matching plates associated with the ultrasonic probe manufacturing process in FIG. 1.

As shown in FIG. 8, the acoustic matching block 73 is cut at a predetermined pitch in a direction perpendicular to the laminating direction (Z-axis) to form a plurality of plate-like acoustic matching members (first acoustic matching plates) 74 (step S4). The upper and lower surfaces of each formed first acoustic matching plate 74 are polished to set its thickness to a thickness required for the first acoustic matching layer 30. This thickness is, for example, 0.3 mm. With this polishing, the first metal layer 72 is exposed onto the upper and lower surfaces of the first acoustic matching plate 74. FIG. 8 shows only the two end portions of the first acoustic matching plate 74 without illustrating the intermediate portion.

Figure 9:
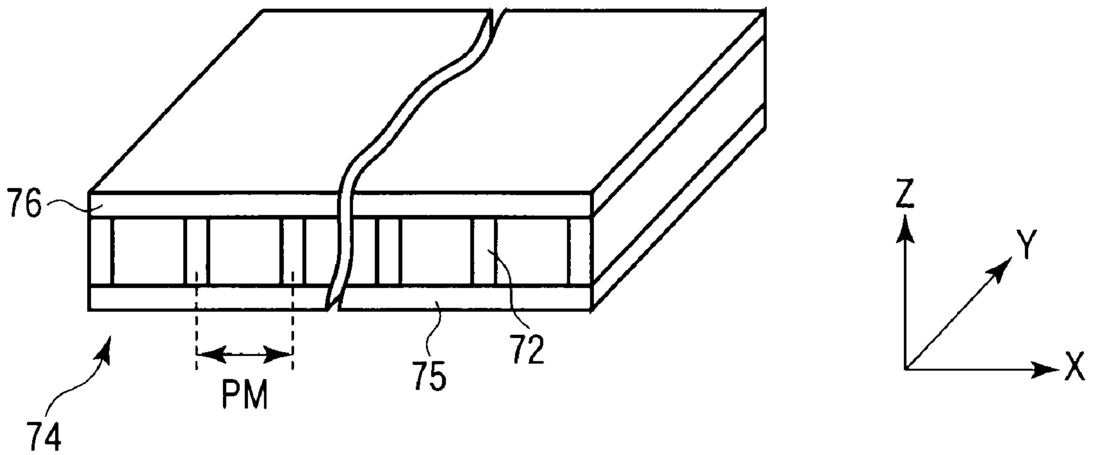
FIG. 9 is a perspective view showing a first acoustic matching plate having metal layers formed on the upper and lower surfaces, which is associated with the ultrasonic probe manufacturing process in FIG. 1.

As shown in FIG. 9, a second metal layer 75 and a third metal layer 76 are respectively formed on the lower and upper surfaces of the first acoustic matching plate 74 by sputtering, vapor deposition, plating, or the like (step S5). With this process, the first acoustic matching plate 74 is completed. The process of forming thin metal films on upper and lower surfaces is performed to improve the certainty and reliability of conduction with the upper electrodes 24 of the transducer unit 20. If, therefore, there is no need to consider the certainty and reliability of conduction, the second metal layer 75 and the third metal layer 76 need not be formed. Note that FIG. 9 shows only the two end portions of the first acoustic matching plate 74 without illustrating the intermediate portion.

The first acoustic matching plate 74 is formed by alternately joining the plurality of columnar non-conductive member plates 71 and the plurality of first metal layers 72. The plurality of first metal layers 72 are arranged at a predetermined pitch PM.

Figure 10:
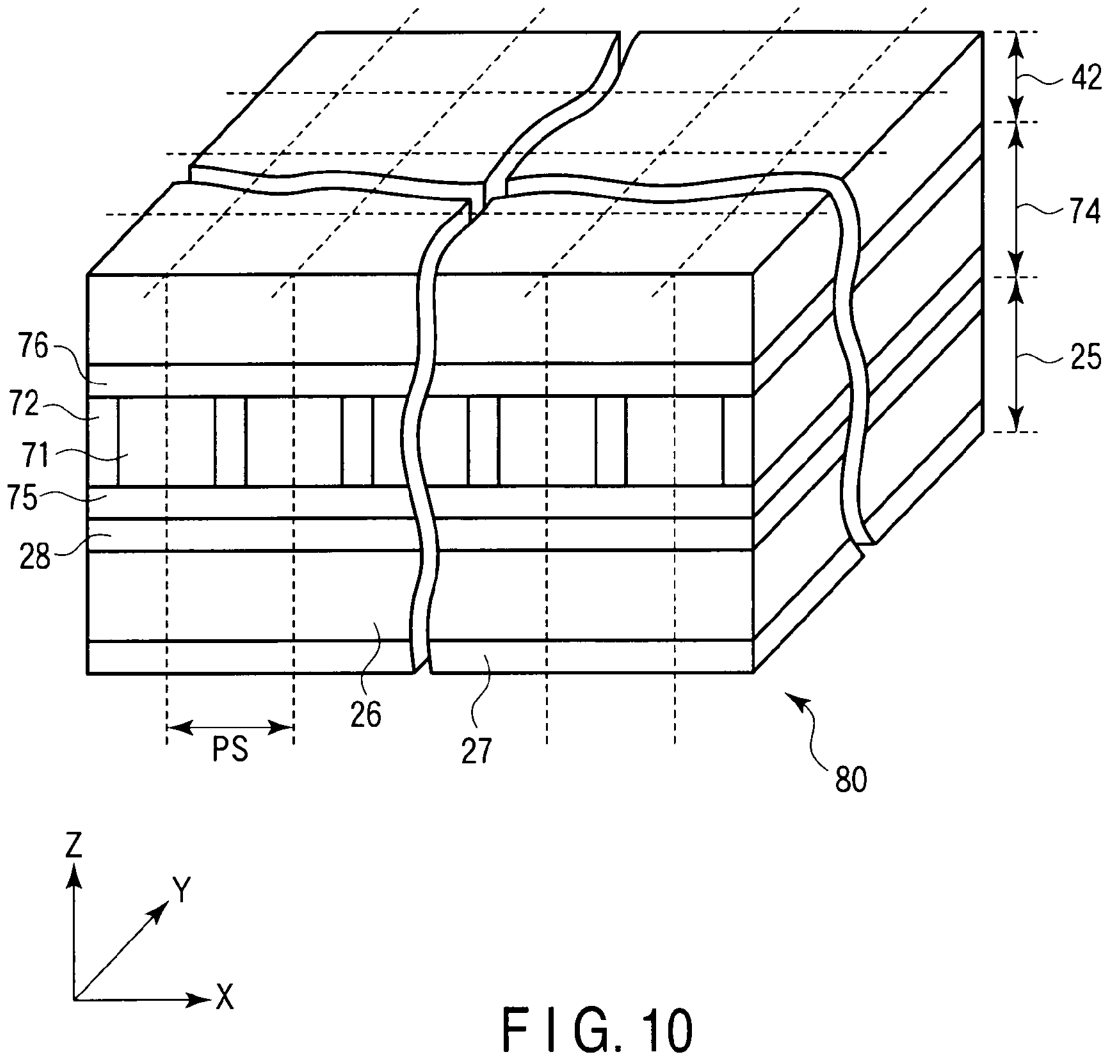
FIG. 10 is a perspective view showing a composite block associated with the ultrasonic probe manufacturing processing in FIG. 1.

As shown in FIG. 10, a composite block 80 is formed by joining the first acoustic matching plate 74, transducer plates 25, and second acoustic matching plates 42 by bonding, metal welding, or the like (step S6). The transducer plate 25 comprises a plate-like piezoelectric member 26, a lower electrode 27 formed on the lower surface of the piezoelectric member 26, and an upper electrode 28 formed on the upper surface of the piezoelectric member 26. The second acoustic matching plate 42 is formed by using carbon or the like as a material. The lower electrode 27 and the first metal layer 72 are almost perpendicular to each other, and so are the upper electrode 28 and the first metal layer 72. Note that the process of forming the composite block 80 described above can use the first acoustic matching plate 74 manufactured in advance.

As indicated by the dotted lines in FIG. 10, the composite block 80 is cut vertically and horizontally at a predetermined pitch along the X- and Y-axes (step S7). With this cutting, the transducer plate 25, the first acoustic matching plate 74, and the second acoustic matching plate 42 are divided into the plurality of transducers 21, the plurality of first acoustic matching elements 31, and the plurality of second acoustic matching elements 41. Cutting positions are set such that each first acoustic matching element 31 always includes one or more first metal layers 72. A cutting pitch PS is determined on the basis of the first metal layer pitch PM. Cutting positions and a cutting pitch will be described in detail later. With this cutting, the first metal layers 72 become the internal metal layers 33, the second metal layers 75 become the lower metal layers 34, and the third metal layers 76 become the upper metal layers 35. With a cutting process, a transducer unit 20, a first acoustic matching layer 30, and a second acoustic matching layer 40 are completed. Note that FIG. 10 shows only the end portions of the composite block 80 without illustrating the intermediate portion.

The above method of manufacturing the first acoustic matching layer 30 is the same as the existing method except for the determination of cutting positions in accordance with a metal layer pitch and the adjustment of a cutting pitch. That is, using the first acoustic matching plate 74 unique to this embodiment makes it possible to manufacture the transducer unit 20, the first acoustic matching layer 30, and the second acoustic matching layer 40 by a low-cost machining process based on the existing technique.

Figure 11:
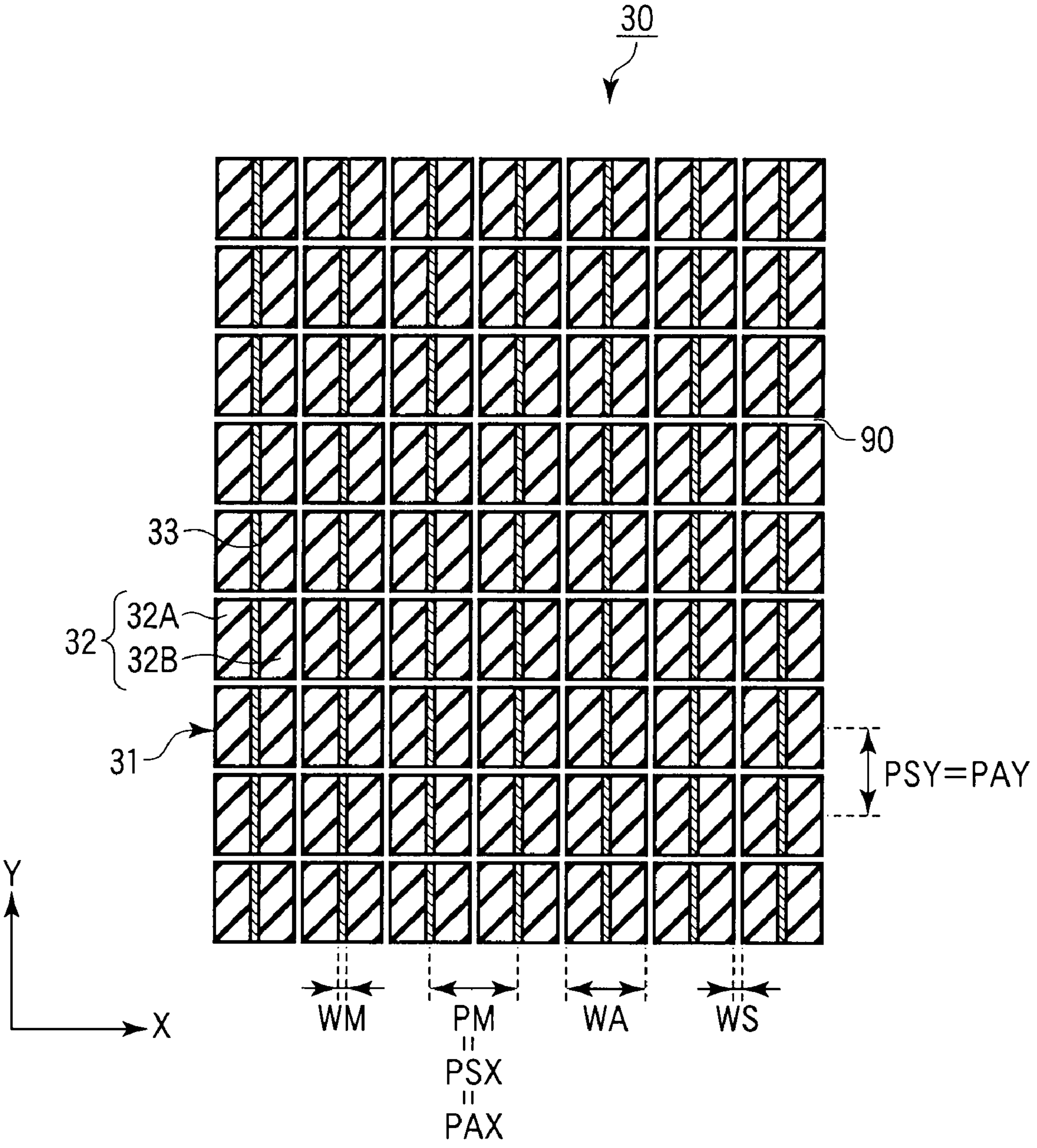
FIG. 11 is a view showing an X-Y section of the first acoustic matching layer in FIG. 1.

The structure of the first acoustic matching layer 30 formed by the above manufacturing method will be described in detail. FIG. 11 is a view showing an X-Y section of the first acoustic matching layer 30. As shown in FIG. 11, the plurality of first acoustic matching elements 31 are separated from each other by a plurality of cut grooves 90 formed in a lattice pattern. The non-conductive member 32 of the first acoustic matching element 31 is divided into two pieces, i.e., a first non-conductive member piece 32A and a second non-conductive member piece 32B by the internal metal layer 33. In other words, the internal metal layer 33 is sandwiched between the first non-conductive member piece 32A and the second non-conductive member piece 32B. That is, the first acoustic matching element 31 has a sandwich structure comprising the first non-conductive member piece 32A, the internal metal layer 33, and second non-conductive member piece 32B.

As shown in FIG. 11, the plurality of internal metal layers 33 are parallel to each other. The internal metal layers 33 are parallel to the cut grooves 90 parallel to the Y-axis, and are perpendicular to the cut grooves 90 parallel to the X-axis. The cut grooves 90 are formed in the non-conductive members 32. A cutting pitch PSX along the X-axis is equal to a first acoustic matching element pitch PAX along the X-axis. The cutting pitch PSX (first acoustic matching element pitch PAX) is almost equal to the internal metal layer pitch PM. In this case, in all the first acoustic matching elements 31, the internal metal layers 33 can be made to have the same array direction and position. A width WM of the internal metal layer 33 along the X-axis is typically 10 μm. A width WS of the cut groove 90 is typically 50 μm.

If widths WA of all the first acoustic matching elements 31 are not strictly equal to each other, the first metal layer 72 (internal metal layer 33) may be cut in the manufacturing process. The non-conductive member plates 71 (see FIG. 5) and the first metal layers 72 have errors in thickness along the X-axis. In some case, therefore, the widths WA of all the first acoustic matching elements 31 cannot be made strictly equal to each other.

Figure 12:
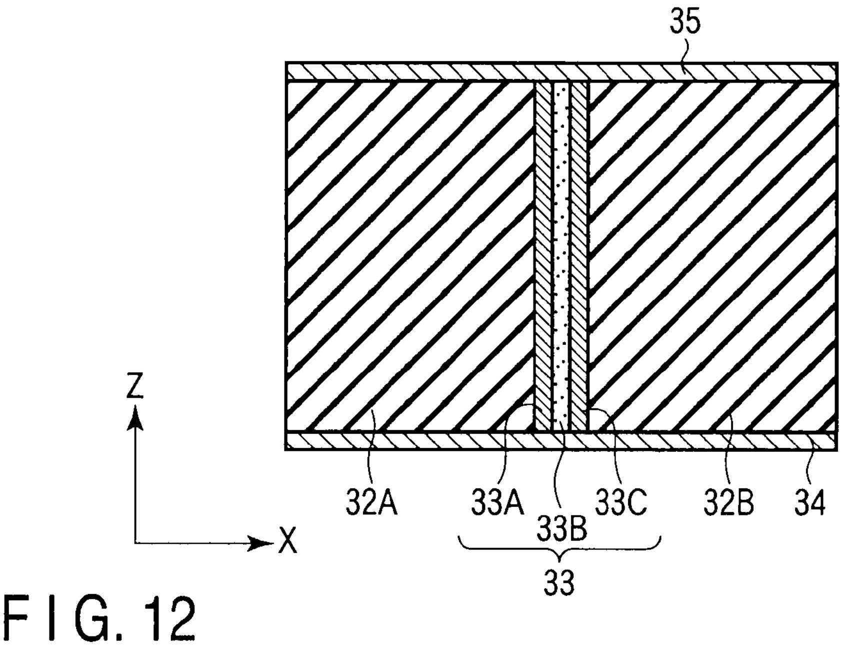
FIG. 12 is an enlarged view showing a Z-X section of the first acoustic matching element in FIG. 11.

If, for example, the non-conductive member plates 71 are bonded with an adhesive, the internal metal layer 33 has a three-layer structure comprising a first internal metal layer 33A, an adhesive layer 33B, and a second internal metal layer 33C, as shown in FIG. 12. It is difficult to make the adhesive layers 33B have a strictly uniform thickness. In some case, therefore, the thicknesses WM of all the internal metal layers 33 cannot be made strictly equal to each other.

Assume that the widths WM of all the first acoustic matching elements 31 are made strictly equal to each other by polishing or the like. Even in this case, if the cutting pitch PSX (first acoustic matching element pitch PAX) is equal to the internal metal layer pitch PM as shown in FIG. 11, cutting positions need to match the non-conductive member 32 in order to make all the first acoustic matching elements 31 include the internal metal layers 33. However, since the second metal layer 75 and the third metal layer 76 are formed on the upper and lower surfaces of the first acoustic matching plate 74, it is impossible to visually recognize the position of the first metal layer 72 (internal metal layer 33). In addition, since the second acoustic matching plate 42 is laminated on the first acoustic matching plate 74, the first acoustic matching plate 74 may be hidden from view. For this reason, a cutting position may overlap the first metal layer 72. If the first metal layer 72 is cut, the upper and lower surfaces of the first acoustic matching element 31 cannot be rendered conductive.

Figure 13:
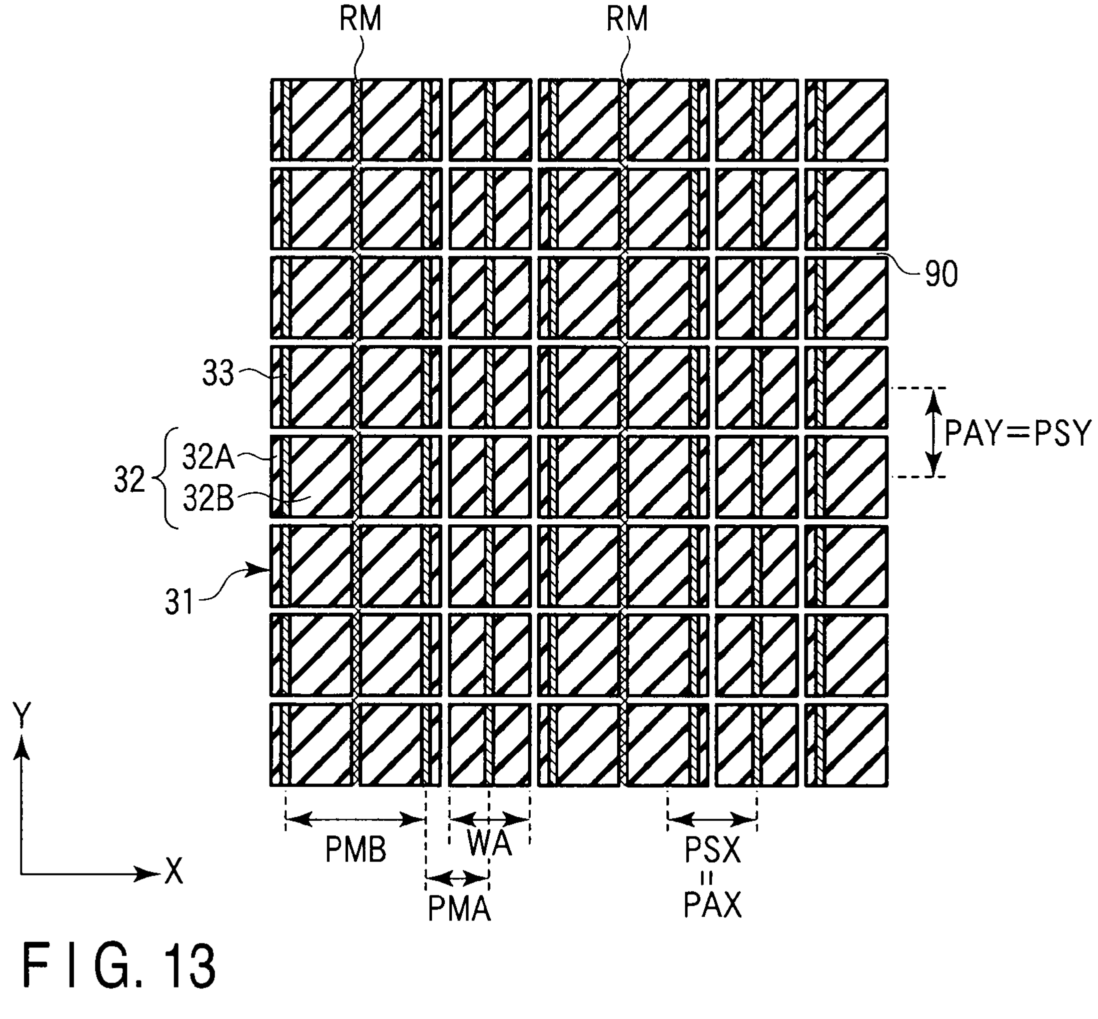
FIG. 13 is a view showing an X-Y section of the first acoustic matching layer in FIG. 1 which is different from the X-Y section in FIG. 11.

As a method of solving the problem that when a cutting position matches the first metal layer 72 (internal metal layer 33), the upper and lower surfaces of the first acoustic matching element 31 cannot be rendered conductive, a method of making the metal layer pitch PM smaller than the cutting pitch PS is available. FIG. 13 is a view showing an X-Y section of the plurality of first acoustic matching elements 31 when the metal layer pitch PM (PMA) is made smaller than the cutting pitch PSX. Areas RM in the cut grooves 90 parallel to the Y-axis are areas in which the internal metal layers 33 (first metal layers 72) have been formed before cutting. That is, this indicates that the internal metal layers 33 have been arranged at a predetermined pitch PMA before cutting. An internal metal layer pitch PMB across the area RM is twice the internal metal layer pitch PMA which does not cross the area RM.

The internal metal layer pitch PMA is smaller than the width WA of the first acoustic matching element 31. In other words, the cutting pitch PSX is larger than the length obtained by subtracting a width WS of the cut groove 90 from the cutting pitch PSX, i.e., the width WA of the first acoustic matching element 31. In this case, each first acoustic matching element 31 can be reliably made to include at least one internal metal layer 33 without performing strict pitch adjustment or cutting position adjustment. This can therefore reliably render the upper and lower surfaces of the first acoustic matching element 31 conductive. This makes it possible to reduce the cost in manufacturing the first acoustic matching plates 74 and reduce the number of steps in joining the transducer plates 25 to the first acoustic matching plates 74.

Although the first acoustic matching layer 30 shown in FIG. 13 includes both the internal metal layer pitches PMA and PMB, adjusting the internal metal layer pitch PMA allows to include only the internal metal layer pitch PMA.

There is available a method of maximizing the internal metal layer pitch PMA (which is parallel to or almost perpendicular to the cut grooves 90) by forming the cut grooves 90 obliquely to the internal metal layers 33 (first metal layers 72).

Figure 14:
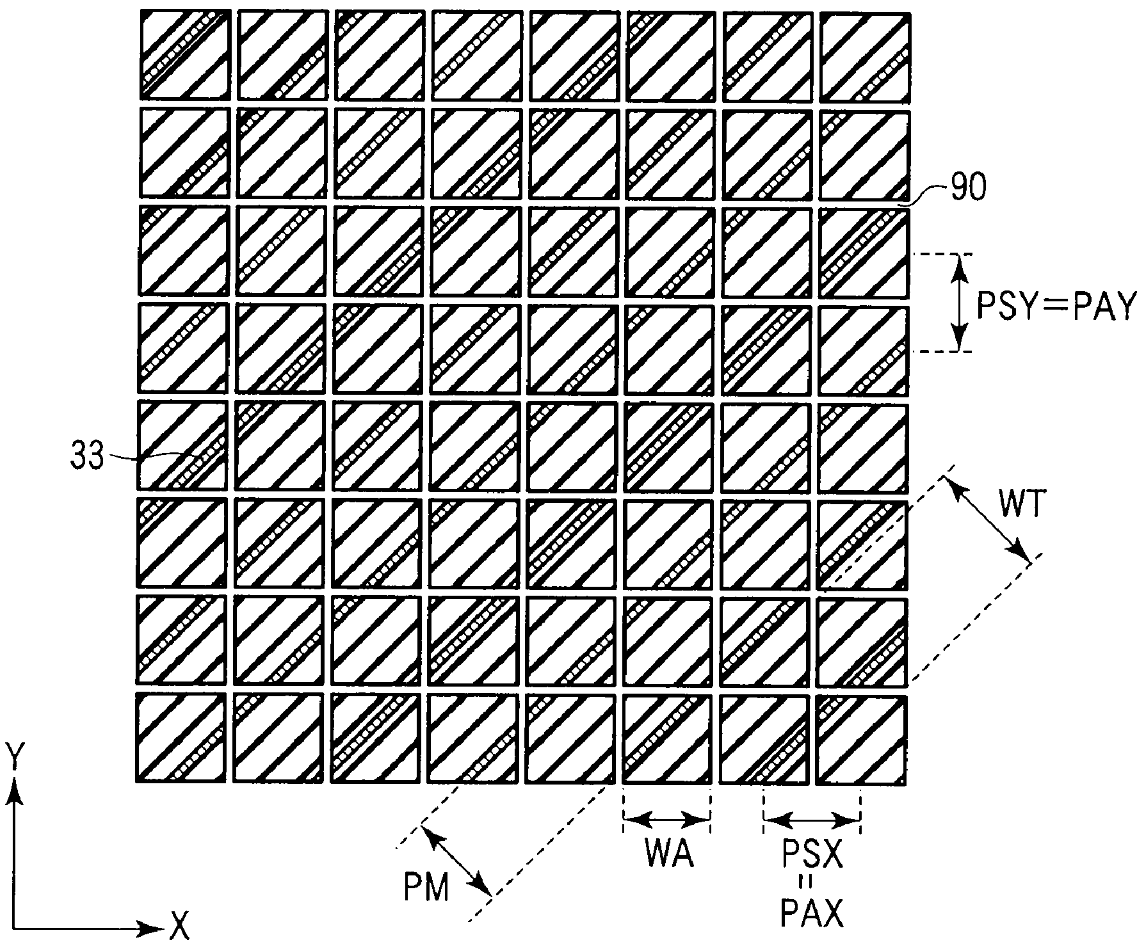
FIG. 14 is a view showing an X-Y section of the first acoustic matching layer in FIG. 1 which is different from the X-Y sections in FIGS. 11 and 13.

FIG. 14 is a view showing an X-Y section of the plurality of first acoustic matching elements 31 when the cut grooves 90 are formed obliquely to the internal metal layers 33. The first acoustic matching element pitch PAX in the X direction is equal to a first acoustic matching element pitch PAY in the Y direction. The internal metal layer pitch PM in FIG. 14 is equal to the internal metal layer pitch PM in FIG. 11.

As shown in FIG. 14, forming the cut grooves 90 obliquely to the internal metal layers 33 can increase the first acoustic matching element pitch PAX as compared with the case in which the cut grooves 90 are perpendicular (parallel) to the internal metal layers 33. If, for example, the cut grooves 90 are formed at an inclination of 45° with respect to the internal metal layers 33, the width WA of the first acoustic matching element 31 can be made about 1.4 times the width set when the cut grooves 90 are perpendicular to the internal metal layers 33. Consequently, the thickness of the first acoustic matching plate 74 can be increased by about 1.4 times. As a result, the strength of the first acoustic matching plate 74 increases, and hence the yield in the manufacturing process of the ultrasonic probe 1 improves.

Note that the first acoustic matching element pitch PAX need not be equal to the first acoustic matching element pitch PAY.

Figure 15:
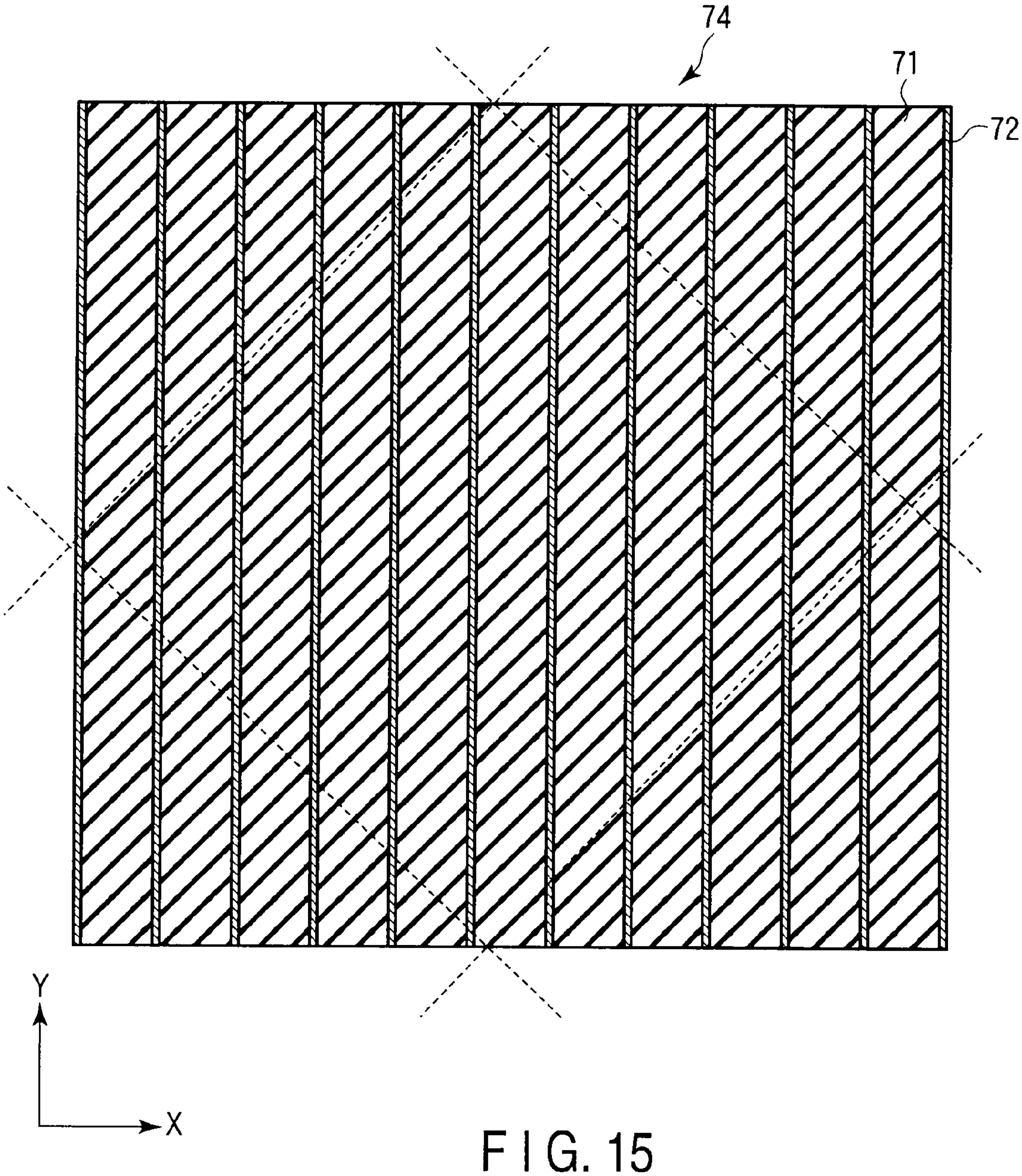
FIG. 15 is a view showing cutting plane lines of the first acoustic matching plate for the formation of the first acoustic matching layer in FIG. 14.

The first acoustic matching layer 30 having the cut grooves 90 formed obliquely to the internal metal layers 33 is formed by cutting the four corners of the first acoustic matching plate 74 obliquely to the first metal layers 72 as indicated by the dotted lines in FIG. 15.

In addition, the internal metal layers 33 need not always be formed inside the non-conductive members 32. For example, the internal metal layer 33 can be formed on a side surface (at least one of a plurality of surfaces perpendicular to the upper and lower surfaces) of the non-conductive member 32 so as to be exposed onto the upper surface and lower surface of the non-conductive member 32.

Figure 16:
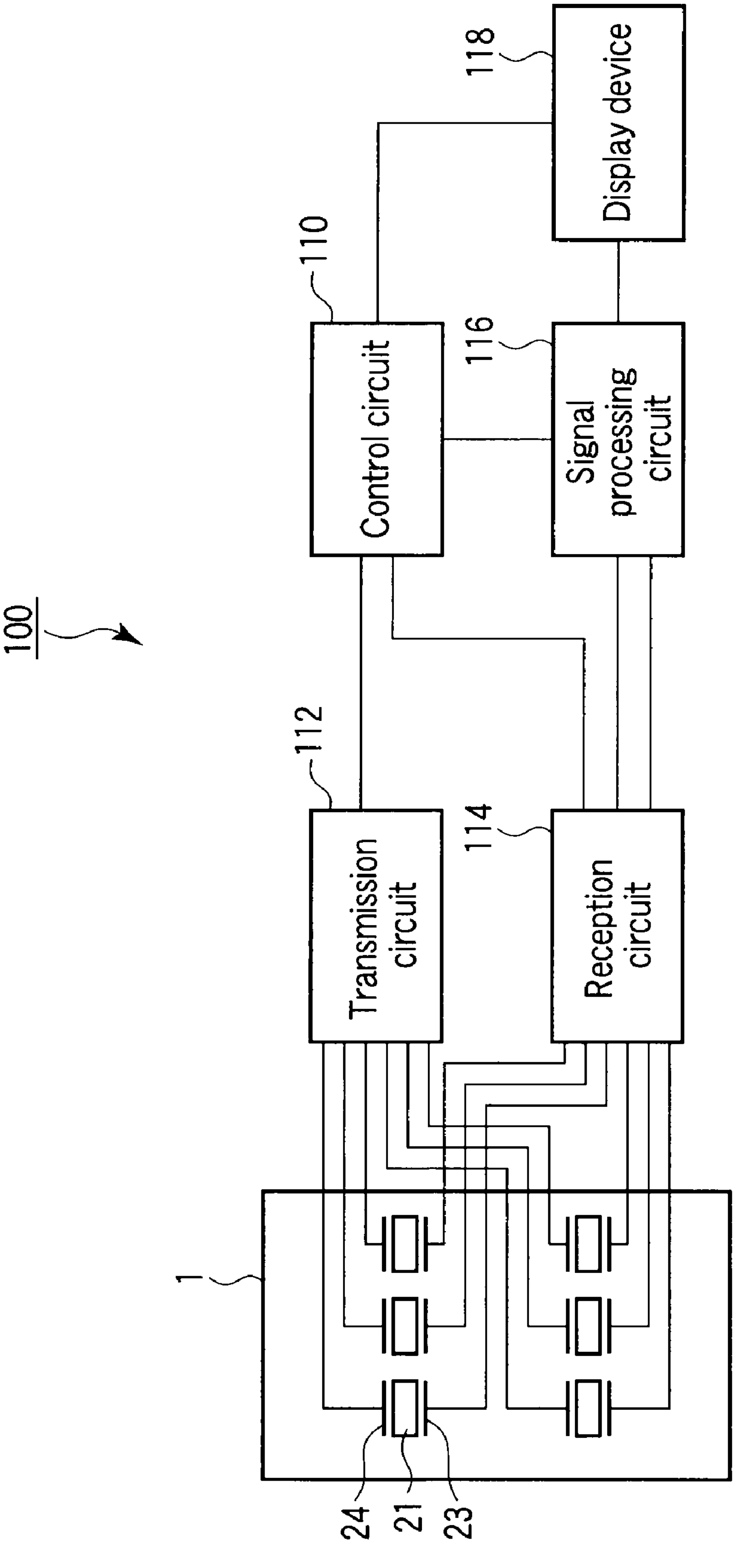
FIG. 16 is a view showing the arrangement of an ultrasonic diagnosis apparatus including the ultrasonic probe in FIG. 1.

An ultrasonic diagnosis apparatus including the ultrasonic probe 1 will be described next. FIG. 16 is a view showing the arrangement of an ultrasonic diagnosis apparatus 100. As shown in FIG. 16, the ultrasonic diagnosis apparatus 100 comprises a control circuit 110 as a central unit, the ultrasonic probe 1, a transmission circuit 112, a reception circuit 114, a signal processing circuit 116, and a display device 118.

Figure 17:
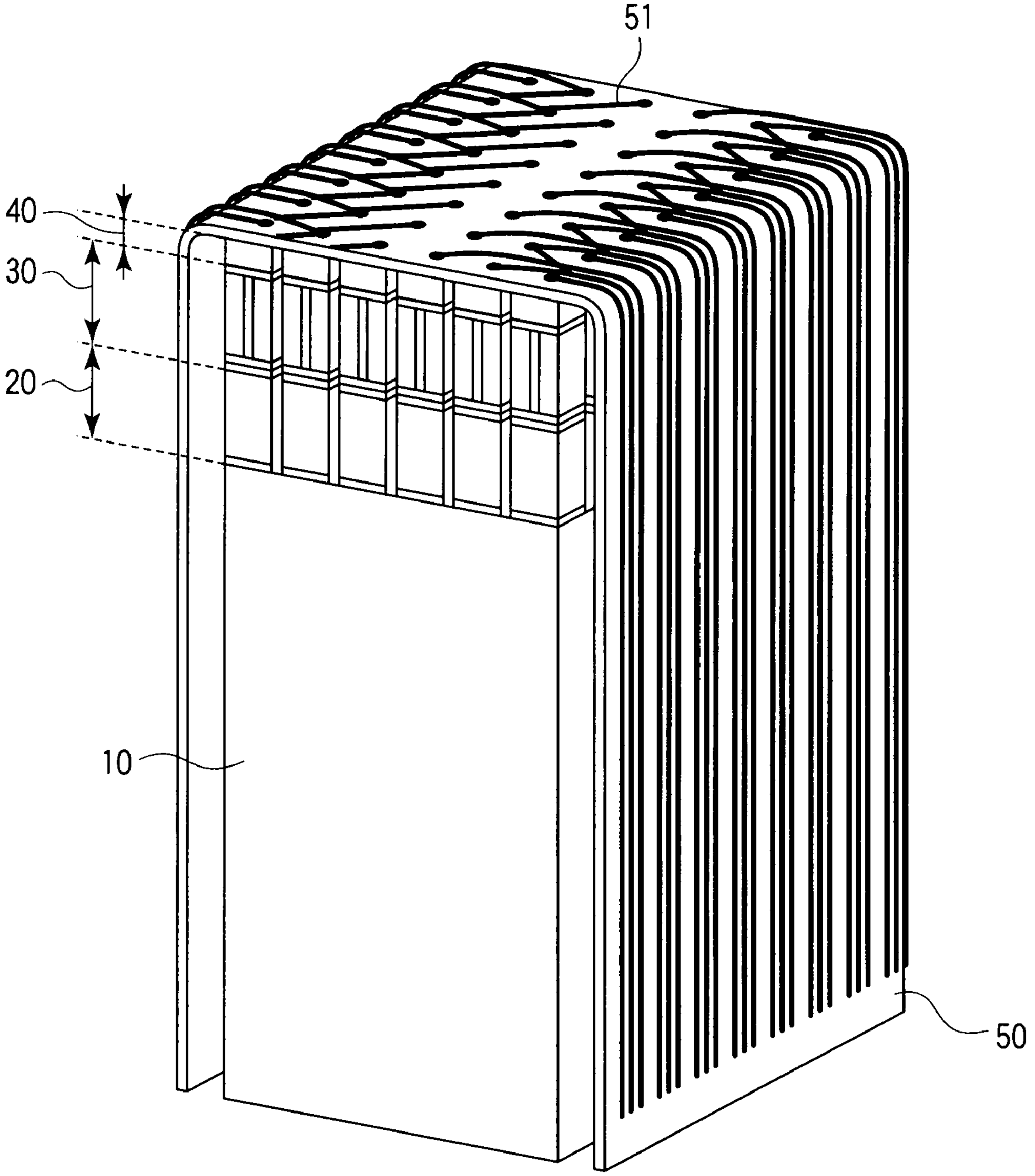
FIG. 17 is a perspective view showing interconnections on a second FPC associated with the ultrasonic diagnosis apparatus in FIG. 16.

The second FPC 50 of the ultrasonic probe 1 electrically extracts each upper electrode 24 independently. FIG. 17 is a perspective view of the second FPC 50 for electrically extracting each upper electrode 24 independently. As shown in FIG. 17, the second FPC 50 has a plurality of interconnections 51 for electrically extracting the plurality of upper electrodes 24 independently. The interconnections 51 are formed out of thin copper foil or the like on the second FPC 50. The second FPC 50 is press-bonded to the second acoustic matching layer 40 upon being positioned to the cut grooves 90. Since signals can be independently extracted from the respective upper electrodes 24 in this manner, the adverse acoustic effects can be reduced. This improves the resolution of images to be generated. The lower electrodes 23 and the upper electrodes 24 are connected to the transmission circuit 112 or the reception circuit 114 via probe cables.

The transmission circuit 112 generates a driving signal for generating an ultrasonic wave, and supplies the generated driving signal to each transducer 21 to make it generate an ultrasonic wave. The reception circuit 114 delays and adds echo signals from the respective transducers 21. The signal processing circuit 116 receives the echo signals from the reception circuit 114 and generates the data of a B mode image or the data of a Doppler image. The display device 118 displays the generated B mode image or Doppler image.

Figure 18:
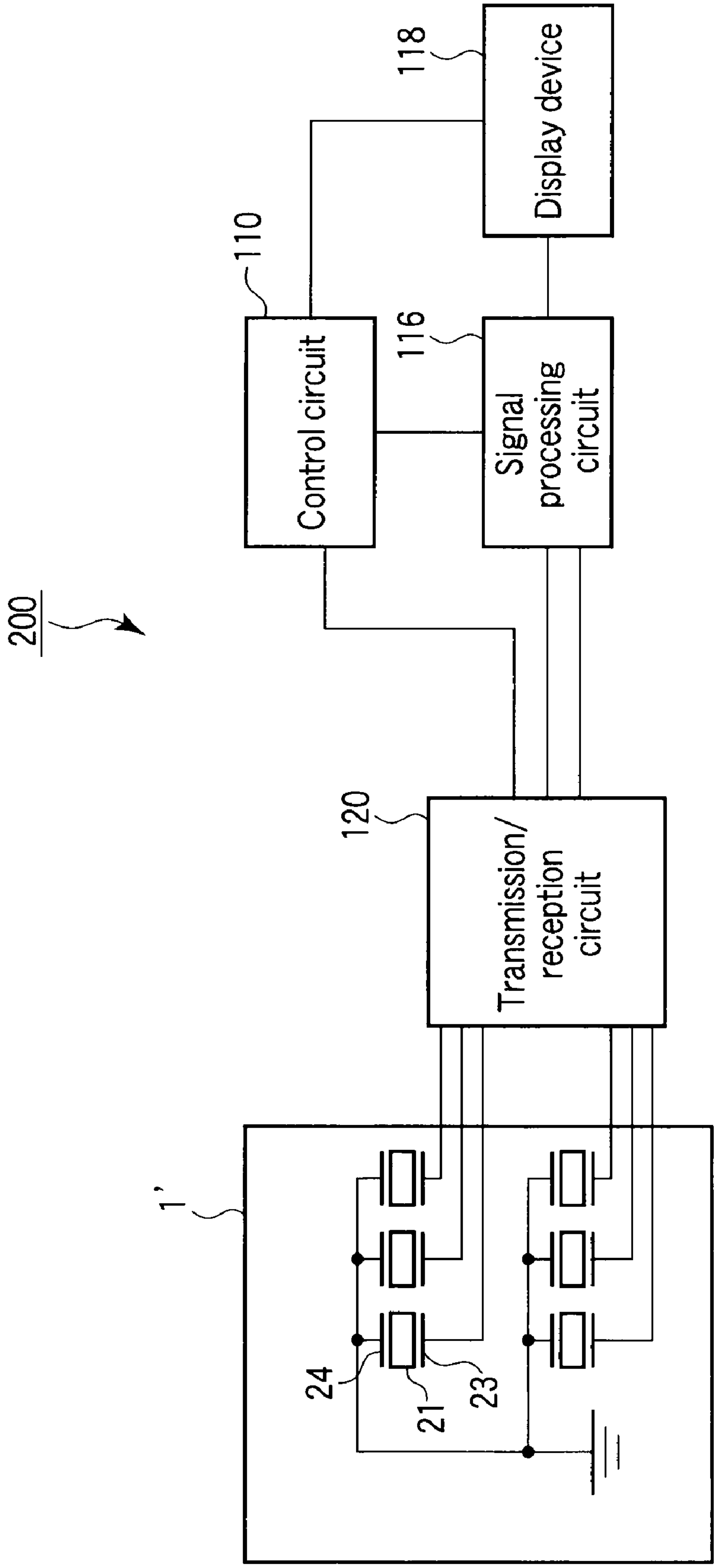
FIG. 18 is a view showing the arrangement of an ultrasonic diagnosis apparatus including the ultrasonic probe in FIG. 1 which is different from the apparatus in FIG. 16.

In some case, the upper electrodes 24 need to be grounded instead of being connected to the transmission circuit 112 or the reception circuit 114. FIG. 18 is a view showing the arrangement of an ultrasonic diagnosis apparatus 200 in this case. As shown in FIG. 18, the ultrasonic diagnosis apparatus 200 comprises a control circuit 110 as a central unit, an ultrasonic probe 1', a transmission/reception circuit 120, a signal processing circuit 116, and a display device 118.

A second FPC 50 of the ultrasonic probe 1' is obtained by press-bonding a film thinly plated with copper on an FPC base. Each upper electrode 24 is connected to the ground level via a probe cable. Each lower electrode 23 is connected to the transmission/reception circuit 120 via a probe cable.

The transmission/reception circuit 120 generates a driving signal for generating an ultrasonic wave, and supplies the generated driving signal to each transducer 21 to make it generate an ultrasonic wave. The transmission/reception circuit 120 delays and adds echo signals from the respective transducers 21.

According to the above arrangement, the internal metal layer 33 is formed to be exposed onto the upper and lower surfaces of each non-conductive member 32 of the first acoustic matching layer 30 having the two-dimensional array structure. According to this embodiment, therefore, the upper and lower surfaces of each element 31 of the first acoustic matching layer 30 can be easily and reliably rendered conductive.

According to the above description, the second FPC 50 is joined to the upper surface of the second acoustic matching layer 40. However, the present invention need not be limited to this. For example, the second FPC 50 may be joined to the upper surface of the first acoustic matching layer. Although three acoustic matching layers are used according to the above description, two or one layer or four or more layers can be used.

In the above ultrasonic probe 1, the backing 10 is joined to the lower portion of the transducer unit 20 via the first FPC. However, the present invention need not be limited to this. For example, in order to prevent ultrasonic waves propagating to the backward of the transducer unit 20 from being reflected by the first FPC, it suffices to join the first acoustic matching layer 30 to not only the upper portion of the transducer unit 20 but also to the lower portion. That is, the plurality of first acoustic matching elements 31 may be joined to the lower portions of the plurality of transducers 21. The backing 10 is joined to the lower portion of the first acoustic matching layer 30 located on the lower side. In this case, the first FPC is not provided between the transducer unit 20 and the first acoustic matching layer 30 on the lower side, but is provided between the first acoustic matching layer 30 on the lower side and the backing 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic probe comprising:

a plurality of piezoelectric elements arrayed two-dimensionally;

a plurality of electrodes respectively formed on the plurality of piezoelectric elements;

a plurality of columnar non-conductive members arranged on the plurality of electrodes; and a plurality of first conductive layers respectively provided for the plurality of non-conductive members, the first conductive layers reaching from arrangement surfaces of the non-conductive members to other surfaces of the non-conductive members, the arrangement surfaces being opposite to the other surfaces.

2. The probe according to claim 1, wherein the non-conductive member comprises a first non-conductive member piece and a second non-conductive member piece, and the first conductive layer is sandwiched between the first non-conductive member piece and the second non-conductive member piece.

3. The probe according to claim 1, wherein second conductive layers are formed on the arrangement surfaces and the other surfaces.

4. The probe according to claim 1, wherein the first conductive layers are substantially perpendicular to the electrodes.

5. The probe according to claim 1, wherein the first conductive layers are parallel to each other.

6. The probe according to claim 5, wherein the arrangement surfaces are defined by a first direction and a second direction, the first direction and the second direction are substantially perpendicular to each other, the non-conductive members are arrayed along the first direction and the second direction, the first conductive layers are formed to be substantially perpendicular to one of the first direction and the second direction, and an interval between the first conductive layers is substantially not more than a center-to-center interval between the non-conductive members along the first direction or the second direction.

7. The probe according to claim 5, wherein the arrangement surfaces are defined by a first direction and a second direction, the first direction and the second direction are substantially perpendicular to each other, the non-conductive members are arrayed along the first direction and the second direction, the first conductive layers are formed to be substantially perpendicular to one of the first direction and the second direction, and an interval between the first conductive layers includes a first interval smaller than a center-to-center interval between the non-conductive members along the first direction or the second direction and a second interval having a length substantially twice the first interval.

8. The probe according to claim 5, wherein the arrangement surfaces are defined by a first direction and a second direction, the first direction and the second direction are substantially perpendicular to each other, the non-conductive members are arrayed along the first direction and the second direction, the first conductive layers are formed obliquely to one of the first direction and the second direction, and an interval between the conductive layers is smaller than a diagonal line of the arrangement surface.

9. The probe according to claim 1, wherein the first conductive layer includes a first layer of the first conductive layer and a second layer of the first conductive layer, and the first layer is bonded to the second layer with a resin adhesive.

10. The probe according to claim 1, wherein the first conductive layer includes a first layer of the first conductive layer of and a second layer of the first conductive layer, and the first layer is metal-welded to the second layer.

11. The probe according to claim 1, wherein the first conductive layer contains at least one material selected from the group consisting of nickel, chromium, copper, tin, silver, and gold.

12. The probe according to claim 3, wherein the second conductive layer contains at least one material selected from the group consisting of nickel, chromium, copper, tin, silver, and gold.

13. The probe according to claim 1, wherein the non-conductive member contains an inorganic substance having an acoustic impedance of 9 to 15 Mrayl.

14. The probe according to claim 1, wherein the non-conductive member comprises a ceramic material containing mica.

15. An ultrasonic diagnosis apparatus configured to scans a subject with an ultrasonic wave via an ultrasonic probe, the ultrasonic probe comprising a plurality of piezoelectric elements arrayed two-dimensionally, a plurality of electrodes respectively formed on the plurality of piezoelectric elements, a plurality of columnar non-conductive members arranged on the plurality of electrodes, and a plurality of conductive layers respectively formed on the plurality of non-conductive members, the conductive layers reaching from arrangement surfaces of the non-conductive members to other surfaces of the non-conductive members, the arrangement surfaces being opposite to the other surfaces.

16. The apparatus according to claim 15, which further comprises a flexible printed circuit board having plurality of interconnections for electrically extracting the plurality of electrodes, and in which the plurality of electrodes are connected to at least one of a transmission circuit which transmits a driving signal to the ultrasonic probe, a reception circuit which receives an echo signal from the ultrasonic probe, and a ground level via the flexible printed circuit board.

17. The apparatus according to claim 16, wherein the flexible printed circuit board is connected to a plurality of conductive members joined to one set of the plurality of non-conductive members and the other surfaces of the plurality of non-conductive members.

18. An ultrasonic probe comprising:

a plurality of transducers having a plurality of piezoelectric elements arrayed two-dimensionally and a plurality of electrodes formed on the plurality of piezoelectric elements; and an acoustic matching layer provided on the plurality of transducers, the acoustic matching layer having a plurality of non-conductive members arrayed two-dimensionally and a plurality of conductive layers for electrically extracting the plurality of electrodes to surfaces of the non-conductive members opposite the piezoelectric elements.

* * * * *